US 6,703,316 B2

(12) United States Patent
Inoue et al.

(10) Patent No.: US 6,703,316 B2
(45) Date of Patent: Mar. 9, 2004

(54) METHOD AND SYSTEM FOR PROCESSING SUBSTRATE

(75) Inventors: Yoichi Inoue, Takasago (JP); Yoshihiko Sakashita, Takasago (JP); Katsumi Watanabe, Kobe (JP); Nobuyuki Kawakami, Kobe (JP); Takahiko Ishii, Takasago (JP); Yusuke Muraoka, Kyoto (JP); Kimitsugu Saito, Kyoto (JP); Tomomi Iwata, Kyoto (JP); Ikuo Mizobata, Kyoto (JP); Takashi Miyake, Kyoto (JP); Ryuji Kitakado, Kyoto (JP)

(73) Assignees: Kabushiki Kaisha Kobe Seiko Sho, Kobe (JP); Dainippon Screen Mfg. Co., Ltd., Kyoto (JP)

( * ) Notice: Subject to any disclaimer, the term of this patent is extended or adjusted under 35 U.S.C. 154(b) by 0 days.

(21) Appl. No.: 10/132,212

(22) Filed: Apr. 26, 2002

(65) Prior Publication Data

US 2002/0160625 A1 Oct. 31, 2002

(30) Foreign Application Priority Data

Apr. 27, 2001 (JP) ........................................ 2001-133004
Aug. 7, 2001 (JP) ........................................ 2001-239084

(51) Int. Cl.$^7$ ............................................. H01L 21/302
(52) U.S. Cl. ........................................ 438/710; 156/345
(58) Field of Search .......................... 438/710; 34/317, 34/318, 58; 134/2

(56) References Cited

U.S. PATENT DOCUMENTS

| 4,347,302 A | * | 8/1982 | Gotman | 430/270.1 |
| 4,778,532 A | * | 10/1988 | McConnell et al. | 134/10 |
| 4,917,123 A | * | 4/1990 | McConnell et al. | 134/95.2 |
| 5,200,017 A | * | 4/1993 | Kawasaki et al. | 156/345.31 |
| 5,306,350 A | * | 4/1994 | Hoy et al. | 134/22.14 |
| 5,700,379 A | | 12/1997 | Biebl | |
| 5,873,177 A | * | 2/1999 | Honda et al. | 34/58 |
| 6,001,191 A | * | 12/1999 | Kamikawa et al. | 134/32 |
| 6,067,727 A | * | 5/2000 | Muraoka | 34/317 |
| 6,110,011 A | * | 8/2000 | Somekh et al. | 451/28 |
| 6,235,122 B1 | * | 5/2001 | Zhang et al. | 134/2 |
| 6,269,552 B1 | * | 8/2001 | Honda et al. | 34/317 |
| 6,352,467 B1 | * | 3/2002 | Somekh et al. | 451/28 |

FOREIGN PATENT DOCUMENTS

| JP | 8-250464 | 9/1996 |
| JP | 9-139374 | 5/1997 |
| JP | 2000-91180 | 3/2000 |

OTHER PUBLICATIONS

H. Namatsu, J. Vac Sci. Technol., vol. B18, No. 6, pp. 3308–3312, "Supercritical Drying for Water–Rinsed Resist Systems", Nov./Dec. 2000.

D. L. Goldfarb, et al., J. Vac. Sci. Technol., vol. B16, No. 6, pp. 3313–3317, "Aqueous–Based Photoresist Drying Using Supercritical Carbon Dioxide to Prevent Pattern Collapse", Nov./Dec. 2000.

* cited by examiner

Primary Examiner—John F. Niebling
Assistant Examiner—Olivia T Luk
(74) Attorney, Agent, or Firm—Oblon, Spivak, McClelland, Maier & Neustadt, P.C.

(57) ABSTRACT

A method and system for processing a substrate includes performing a wet process by supplying a working liquid to a substrate in a wet processing apparatus, transferring the substrate in a non-dry state from the wet processing apparatus to a drying apparatus, and subjecting the substrate to a supercritical drying by a supercritical fluid in the drying apparatus.

18 Claims, 5 Drawing Sheets

METHOD AND SYSTEM FOR PROCESSING SUBSTRATE

BACKGROUND OF THE INVENTION

1. Field of the Invention

This invention relates to a substrate processing method and a substrate processing system applicable to production of such substrates as semiconductor wafers, glass substrates for liquid crystal display panels and plasma display panels (PDPs), printed circuit boards and the like, and more particularly to a substrate processing method and system in which development, deposition, washing, etching, rinsing, and replacement, etc., are performed using liquid or in the so-call wet processing way, and the substrates are dried utilizing a supercritical fluid.

2. Description of the Related Art

As well known, in the field of manufacturing semiconductor substrates, formation of fine patterns or microstructure on a semiconductor substrate has been rapidly developed. Ten years ago, the size of a wiring in a semiconductor substrate is about 1 $\mu$m. Nowadays, the size of a wiring has been reduced to about 0.18 $\mu$m, and even semiconductor devices having a wiring size of 0.13 $\mu$m have almost come into practical use. Further, researches and developments to manufacture semiconductor devices having a wiring size from 0.10 $\mu$m to 0.07 $\mu$m or even of 0.05 $\mu$m have been started.

As production of semiconductor devices having fine patterns has been developed, a capillary force that has not been considered in the production of semiconductor devices having no fine patterns must be considered as a factor in the production of semiconductor substrates having fine patterns. Generally, in producing semiconductor substrates or devices, a number of kinds of liquid are supplied to a substrate one after another prior to washing with deionized water and drying. Since the size or width of a wiring on a substrate is very small to form a fine pattern, it is likely to occur that resists are attracted to each other owing to a capillary force caused by a boundary tension of a liquid between a gas and a liquid after development, resulting in collapse of resists.

Such a phenomenon is also likely to occur in producing electromechanical devices such as a micro electromechanical system having a small rigidity such as a micro cantilever. More specifically, it is a general practice in production of such a device to remove a layer or layers by etching with an aqueous solution containing hydrofluoric acid, potassium hydroxide (KOH) or the like to obtain a certain configuration, followed by washing with a rinsing liquid and drying. In the process, however, it is likely to occur that cantilevers adhere to each other or a cantilever adheres to a base layer mounting the cantilever.

Similar problems are likely to occur in formation of porous insulating layers having a low dielectric constant. The dielectric constant of such an insulating layer is lowered by raising the porosity. Specifically, a liquid film is formed by spin coating, and gelled. After liquid replacement and other processing, drying is performed. In this drying processing, a porous structure in the insulating film is likely to collapse owing to a capillary force caused by the porous structure itself.

It can be conceived that the influence by a capillary force accompanied by production of semiconductor substrates having a microstructure, namely, falling and collapse of the microstructure, has caused and will cause the serious problem in the present and future technology of producing semiconductor substrates having microstructures.

Figure 6:
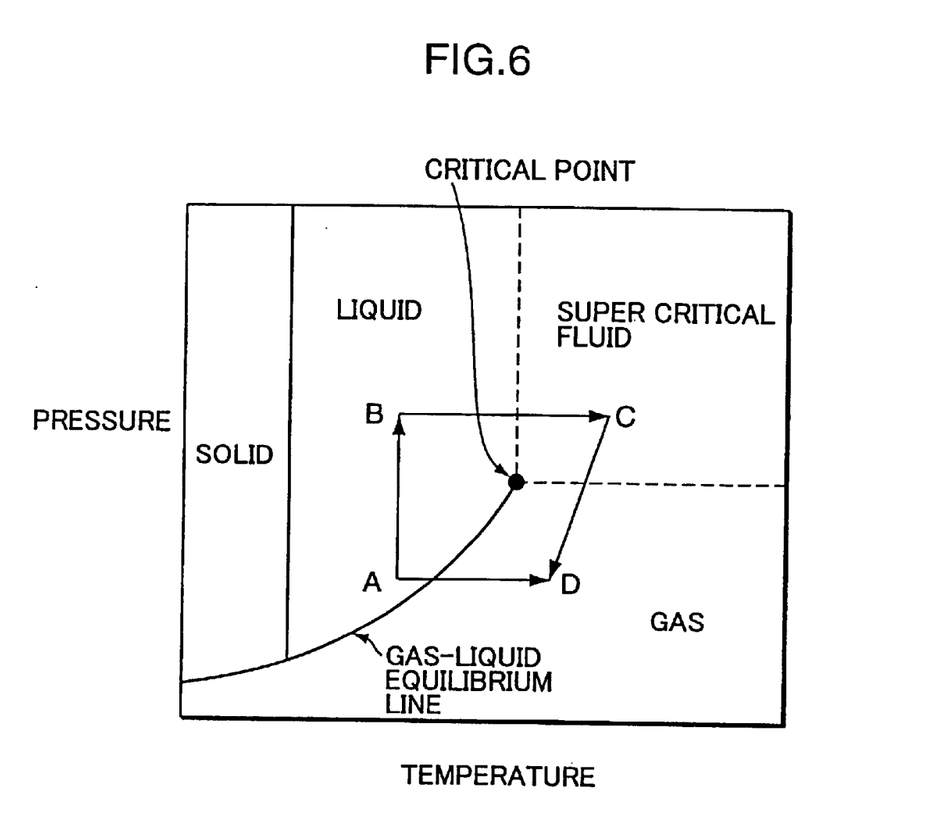
FIG. 6 is a phase diagram showing phase changes in association with pressure and temperature.

There have been proposed several methods in attempt to solve these problems. Among the proposed methods, supercritical drying technique of drying with supercritical carbon dioxide or supercritical fluid has been regarded as having some advantages, and gained public attention recently. A brief description of the supercritical drying technique is made as follows. As shown in the phase diagram of FIG. 6 concerning phase changes in association with pressure and temperature, in the ordinary drying manner that is performed merely by raising the temperature or Liquid A changes to Gas D, Liquid A inevitably passes an equilibrium line between a gas phase and a liquid phase. Accordingly, in the course of Liquid A to Gas D in this drying manner, a capillary force occurs in a gas-liquid interface when Liquid A passes the equilibrium line. In the supercritical drying manner that is performed by changing a liquid phase to a gas phase via a supercritical state or Liquid A→Liquid B under a high pressure→Supercritical fluid C→Gas D, on the other arm, Liquid A does not pass the equilibrium line in the process of changing into Gas D. In view of this, the supercritical drying is advantageous in drying semiconductor substrates because of no capillary force.

For example, J. Vac. Sci. Technol. B18(6), November/December 2000, "Supercritical drying for water-rinsed resist systems" in p 3308, and "Aqueous-based photoresist drying using supercritical carbon dioxide to prevent pattern collapse" in p 3313 refers to a problem of resist collapse in drying, and advantages of the supercritical drying as means for solving the problem.

Japanese Unexamined Patent Publication No. (HEI) 8-250464 recites a problem that parts of MEMS are likely to adhere to each other at the time of drying, and advantages of the supercritical drying as means for solving the problem. This publication shows a method and system in which a series of processings are all carried out in a common high-pressure vessel or chamber, that is, the so-called "one-bath" processing way.

In this method and system, a series of steps including placing a substrate in a high-pressure vessel of a supercritical processing apparatus, etching it with a liquid of strong acid, rising it with deionized water, and replacing the deionized water with an alcohol are carried out. Thereafter, liquefied carbon dioxide is introduced in the high-pressure vessel to replace the alcohol, and the carbon dioxide is brought into a supercritical state by raising the temperature of the vessel for supercritical drying. Thereafter, the high-pressure vessel is depressurized.

The above method and system are promising in concept, but involves many problems in practice. It is difficult to put the above method and system into practice for the following reasons.

In the wet processing way, liquids of strong acid or strong alkali are used. Such liquids are liable to corrode an inner surface of members constituting the high-pressure vessel. Accordingly, introduction of these liquids into the high-pressure vessel is not desirable in the aspect of safety. Namely, the above-mentioned method and system utilizing the one-bath processing way remarkably restricts the kind of usable liquid, thereby hindering use of a wide variety of liquids. There is an idea of coating the inner surface of the vessel with a fluoroethylene resin to provide resistance against corrosion. The coating is effective for a short-term use. However, it is difficult to keep the corrosion resistance effective for a long term under a high pressure. Further, even if the inner surface of the vessel is coated with fluoroethylene resin, it is practically difficult to coat the entire inner surfaces of all the parts connected with the vessel, such as the inner surface of small-diametrical pipes, joints, high-pressure valves and the like with such a corrosion resistive agent. Consequently, this idea is also not practical.

Further, in the abovementioned method and system utilizing the one-bath processing way, the high-pressure vessel is subjected to a high pressure. Accordingly, the diameter of pipes and the like connected to the high-pressure vessel cannot be made to be as large as those connected to an ordinary vessel used in the wet processing way. This will take a long time to supply and discharge a liquid in and out of the vessel through such small-diametrical pipes, which consequently obstructs the productivity. Furthermore, the high-pressure vessel is used in even a processing which does not practically require such high-pressure vessel. This is economically undesirable. Thus, the one-bath processing way is the impractical processing method.

SUMMARY OF THE INVENTION

It is an object of the invention to provide a method and system for processing a substrate which are free from the above problems residing in the prior art.

According to an aspect of the invention, a substrate is processed by supplying a working liquid in a wet processing apparatus. The processed substrate is transferred in a non-dried state from the wet processing apparatus to a drying apparatus where the substrate is subjected to a supercritical drying by a supercritical fluid in the drying apparatus.

These and other objects, features, and advantages of the present invention will become more apparent upon reading the following detailed description along with the accompanying drawings.

DETAILED DESCRIPTION OF THE PREFERRED EMBODIMENTS OF THE INVENTION

Figure 1:
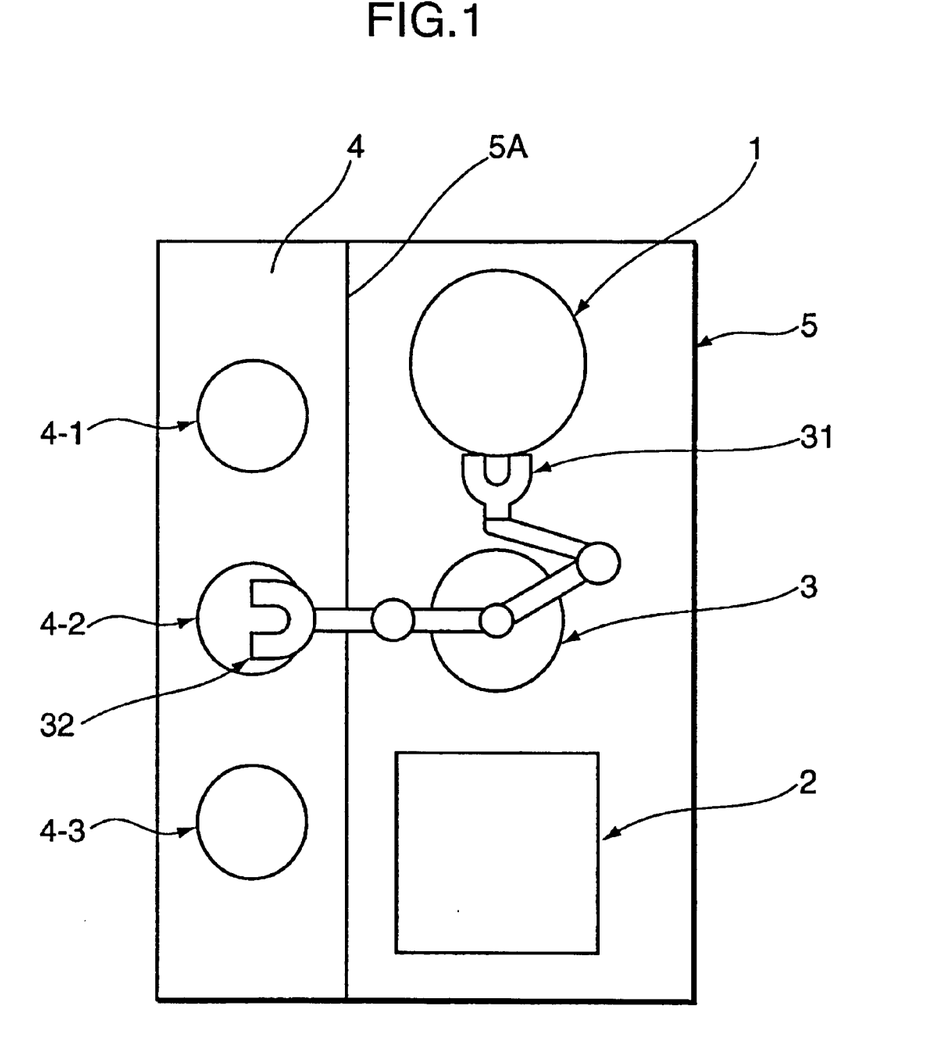
FIG. 1 is a plan view schematically showing a substrate processing system according to a first embodiment of the invention.
Figure 2:
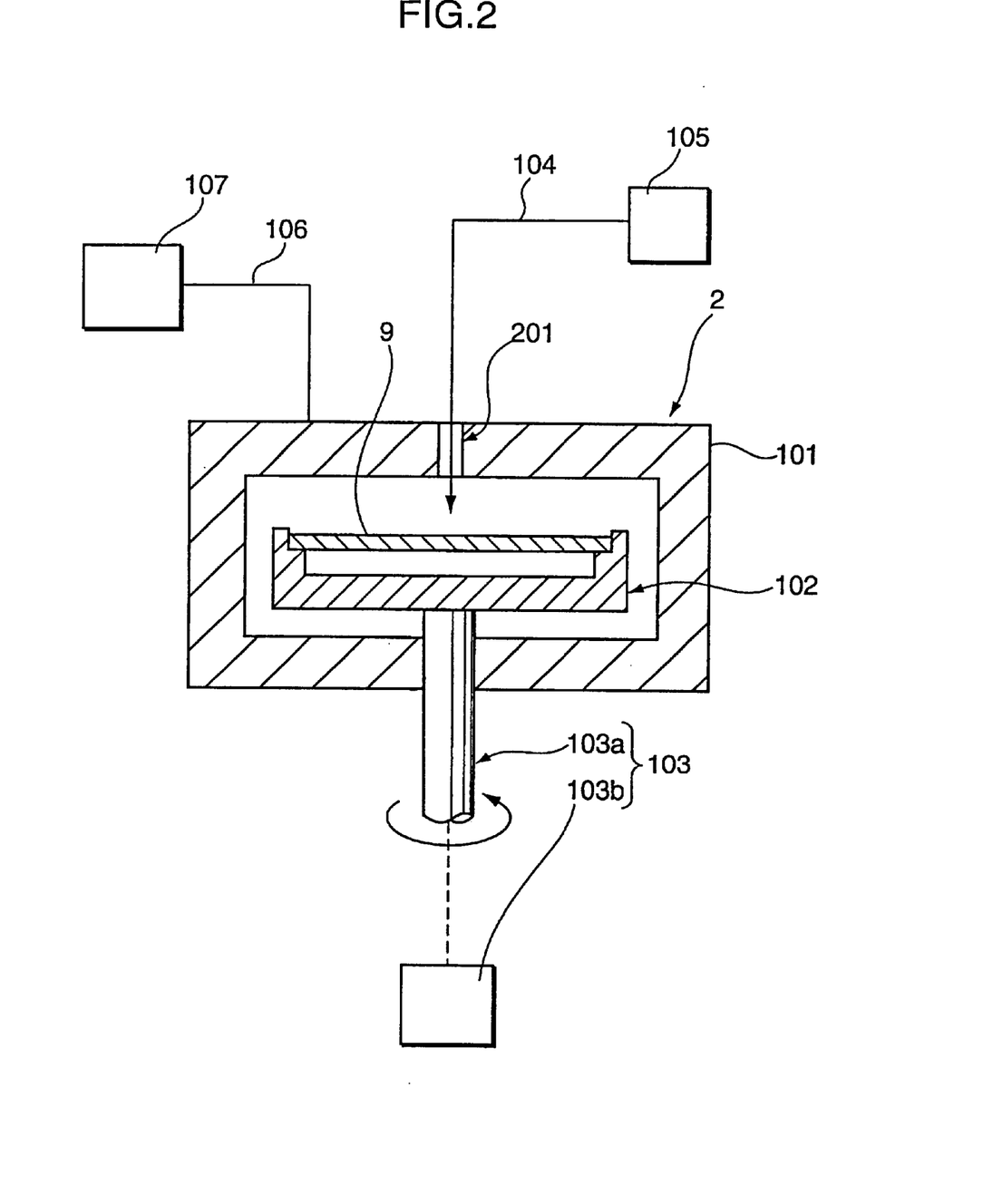
FIG. 2 is a sectional view showing an arrangement of a drying apparatus of the substrate processing system.

Referring to FIGS. 1 and 2, a substrate processing system shown in FIG. 1 is adapted for processing a semiconductor wafer (hereinafter, referred to as "wafer") as an example of substrates. The system includes a wet processing apparatus 1 for supplying working liquids one after another to wafers to perform wet processings, a drying apparatus 2 for drying the wafers, a cassette station 4, and a wafer transferring apparatus 3 for transferring wafers. All the apparatus are mounted on a base block of the system.

The wet processing apparatus 1, the drying apparatus 2, and the wafer transferring apparatus 3 are accommodated in a housing 5 on the base block. The wet processing apparatus 1 and the drying apparatus 2 are partitioned from the cassette station 4 by a partition wall 5A of the housing 5. The substrate processing system is generally installed in a clean room. However, the cleanness of the interior of the housing 5 is monitored and regulated according to needs.

The wet processing apparatus 1 performs such processings as developing, etching, washing, coating, gelation, and rinsing to wafers using liquids. In the system shown in FIG. 1, there is provided a single wet processing apparatus. Alternatively, it may be possible to provide two or more wet processing apparatus side by side according to needs.

The drying apparatus 2 is adapted to dry wafers 9 with use of a supercritical fluid. The drying apparatus 2 includes a high-pressure vessel 101 for drying the wafers therein, as shown in FIG. 2.

The high-pressure vessel 101 is formed with a closable opening (not shown) through which a wafer 9 is loadable and unloadable thereto and therefrom. Referring to FIG. 2, the high-pressure vessel 101 has a wafer holder 102 therein. The wafer holder 102 is connected to a driving mechanism 103 including a support shaft 103a and a driving source or motor 103b. The wafer holder 102 is rotatable in response to driving of the driving source 103b.

The high-pressure vessel 101 is communicated to a protecting liquid supplying source 105 via a liquid inlet 201 and a supplying pipe 104. The high-pressure vessel 101 is also communicated to a supercritical fluid supplying source 107 via a fluid inlet (not shown) and a supplying pipe 106.

A protecting liquid supplied from the protecting liquid supplying source 105 is adapted for preventing the wafer 9 from drying up. Specifically, a working liquid identical to a working liquid supplied to the wafer 9 at a final step of the wet processing. In this embodiment, deionized water, namely, a rinsing liquid to be described later, is used as the protecting liquid. The liquid inlet 201, the supplying pipe 104, and the protecting liquid supplying source 105 constitute a liquid supplier.

In this embodiment, carbon dioxide is used as a supercritical fluid. The supercritical fluid has its temperature and pressure regulated at the fluid supplying source 107 prior to being supplied to the high-pressure vessel 101. The drying apparatus 2 is connected with a pressurizing/depressurizing unit which is arranged outside the clean room.

The cassette station 4 includes a plurality of cassettes each accommodating wafers 9 stacked one over another therein to allow the wafer transferring apparatus 3 to transfer wafers 9 one by one. The cassette station 4 includes three cassettes 4-1, 4-2, and 4-3. Cassettes are loaded and unloaded to and from the cassette station 4 by a handling machine (not shown).

The wafer transferring apparatus 3 transfers wafers 9 one after another between the wet processing apparatus 1, the drying apparatus 2, and the cassettes in the cassette station 4. The wafer transferring apparatus 3 includes, for example, a scalar type robot having two horizontally extending articulated arms with a pair of a first arm 31 and a second arm 32 at respective distal ends thereof. The first arm 31 and the second arm 32 are each provided with a swingable wafer support portion. The wafer transferring apparatus 3 is arranged at an appropriate position between the wet processing apparatus 1 and the drying apparatus 2.

The first arm 31 or first transfer is adapted to transfer wet wafers, namely, to transfer wafers 9 from the wet processing apparatus 1 to the drying apparatus 2. The second arm 32 or second transfer is adapted to transfer dry wafers, namely, to transfer wafers 9 from a cassette in the cassette station 4 to the wet processing apparatus 1, and wafers 9 from the drying apparatus 2 back to the cassette.

Independent manipulation of the both arms 31 and 32 for the respective purposes as mentioned above enables to prevent the wafers 9 from being contaminated by moisture adhered to the arm when wafers 9 are being transferred for a wet processing or when wafers 9 after supercritical drying are being transferred for a cassette.

In the arrangement of the substrate processing system mentioned above, wafers 9 are processed as follows. First, one of wafers to be processed is taken out of the cassette 4-1 (or 4-2, or 4-3) in the cassette station 4 by the second arm 32 of the wafer transferring apparatus 3, and is transferred to the wet processing apparatus 1 for a predetermined wet processing.

For instance, in the case where developing is performed in the wet processing apparatus 1, namely, the wet processing apparatus 1 serves as a developing apparatus, an alkali aqueous solution is supplied to the surface of the wafer 9 dropwise for developing. Generally, it takes about 45 seconds to 1 minute for developing. Upon lapse of a predetermined time after supply of the developing liquid or completion of developing, rinsing is performed with a rinsing liquid (in this embodiment, deionized water). A time required for rinsing is generally the same as the developing time. It may be preferable to additionally rinse the wafer 9 with an organic solvent having higher affinity to carbon dioxide than deionized water after the rinsing with deionized water in order to promote the effect of supercritical drying which is implemented later.

When the rinsing is completed in the wet processing apparatus 1, the wet wafer 9 is taken out of the wet processing apparatus 1 and is transferred to the drying apparatus 2 by the wafer transferring apparatus 3. In the developing process, it is a general practice to spin-dry the wafer 9 after the rinsing by rotating the wafer 9 at such a high speed as 3,000 rpm. However, in this embodiment, a wafer 9 is taken out of the wet processing apparatus 1 without performing such drying process including spin-drying in the wet processing apparatus 1, and is transferred to the drying apparatus 2 in a non-dried state. After the developing process in the wet processing apparatus 1, the first arm 31 of the wafer transferring apparatus 3 promptly transfers the wafer 9 from the wet processing apparatus 1 to the drying apparatus 2 by the time that the wafer 9 air-dries up.

When the wafer 9 is placed on the wafer holder 102 of the drying apparatus 2, deionized water is supplied to the wafer 9 from the supplying source 105 via the supplying pipe 104 to additionally supply deionized water by an amount that is presumed to correspond to a lost amount during the transfer of the wafer 9. In other words, supply of deionized water at this stage prevents the wafer 9 from air-drying before supercritical drying is started. Further, supply of deionized water at this stage washes away fine foreign matters such as dusts adhered on the wafer 9 during the transfer, thereby keeping the wafer 9 from drying in the state that such foreign matters adhere thereto.

When deionized water is supplied to the drying apparatus 2 as mentioned above, the wafer holder 102 is rotated by the driving mechanism 103 to rotate the wafer 9, according to need. Specifically, supply of deionized water to the wafer 9 while rotating the wafer 9 enables to efficiently remove foreign matters such as dusts owning to a centrifugal force exerted to the wafer 9, and to keep the wafer surface in a uniformly non-dried state with a minimal liquid supply.

After the deionized water supply, supercritical carbon dioxide with its temperature and pressure regulated at the supplying source 107 is supplied to the drying apparatus 2 via the supplying pipe 104 so that the interior of the high-pressure vessel 101 is brought to a supercritical state having a temperature of 35° C. and a pressure of 9 Mpa, for example. The drying apparatus 2 serves as the supercritical drying apparatus.

When the interior of the high-pressure vessel 101 is brought to a predetermined supercritical state by supplying the supercritical carbon dioxide, the supercritical state is retained for a predetermined period, thereby enabling to perform a supercritical drying process to the wafer 9. In this case, it may be preferable to rotate the wafer 9 by drivingly rotating the wafer holder 102 to promote the drying for the following reason. Specifically, it takes a considerable time to dissolve all the deionized water adhered on the wafer 9 in the supercritical carbon dioxide for discharge and removal. However, the wafer 9 can be efficiently dried in a short period by removing most part of the deionized water adhered on the wafer 9 utilizing a centrifugal force exerted to the wafer 9 by rotating the wafer 9 in combination with dissolving the remaining small amount of the deionized water that stays on the wafer 9 spot by spot in the supercritical carbon dioxide for discharge and removal. Preferably, the rotating speed of the wafer 9 in this process is not so high as spin-drying (rotating speed of about 3,000 rpm) that is implemented after a general wet process, but is as low as allowing the liquid on the wafer 9 to smoothly flow out of the wafer 9 (rotating speed of about 20 to 500 rpm). The rotating speed is regulated in an appropriate range to effectively remove liquid residue from the wafer 9 without a likelihood of causing collapse of a microstructure of the wafer 9 due to a centrifugal force exerted to the wafer 9.

Upon lapse of a certain period after the supercritical drying, the pressure inside the high-pressure vessel 101 is lowered to an atmospheric pressure. Then, the dry wafer 9 is taken out of the drying apparatus 2 by the second arm 32 of the wafer transferring apparatus 3, and is transferred to the cassette station 4 in the predetermined cassette 4-1 (or 4-2 or 4-3). In this way, the series of processeings are completed with respect to one wafer 9.

According to the substrate processing system of this embodiment, a wafer 9 is subjected to a predetermined wet process in the wet processing apparatus 1 followed by rinsing with deionized water, and is transferred in a non-dried state to the drying apparatus 2 provided independently of the wet processing apparatus 1 by the wafer transferring apparatus 3. In this embodiment, the wet processing and the supercritical drying processing are performed in the respective apparatus. This arrangement is free from constraint in selecting a working liquid having a required chemical property usable for the wet processing in view of its use in a high-pressure vessel, thereby enabling use of an expanded kinds of working liquid. Further, the drying apparatus 2 is free from the problems such as corrosion by a working liquid and is capable of performing supercritical drying of a wafer 9 without protecting the inner surface of the high-pressure vessel with a corrosion resistive agent. Further, this arrangement eliminates the drawback of the one-bath processing system that a long time is required to supply and discharge a working liquid in and out of the high-pressure vessel through the small-diametrical pipe. In this embodiment, however, the wafer 9 can be processed in a shorter time, which enhances the productivity.

In the case of independently performing the wet processing and the supercritical drying process in the wet processing apparatus 1 and the drying apparatus 2, respectively, there is the likelihood that a wafer 9 is air-dried during transfer of the wafer 9 after the wet processing. Specifically, when the wafer 9 is air-dried on the way of transfer, a capillary force is acted on the microstructure on the wafer 9, thereby collapsing a part of the microstructure. This ruins the effect of the supercritical drying. According to the substrate processing system of the first embodiment, however, since the wafer transferring apparatus 3 is arranged between the wet processing apparatus 1 and the drying apparatus 2, a wafer 9 can be transferred from the wet processing apparatus 1 to the drying apparatus 2 in a shorter time. Further, the wafer 9 is taken out of the wet processing apparatus 1 and is transferred in the non-dried state to the drying apparatus 2 immediately after the wet processing without performing the so-called spin-drying of the wafer 9. Furthermore, deionized water is supplied to the wafer 9 immediately after loading of the wafer 9 into the drying apparatus 2 to prevent the wafer from air-drying. This arrangement is effective in keeping the wafer 9 from being air-dried during the time after the wet processing is completed and before the supercritical drying is started.

In the above substrate processing system, spin-drying of a wafer 9 by high-speed rotation is not performed after the wet processing. This arrangement eliminates the drawback that the microstructure on the wafer 9 collapses due to a centrifugal force exerted to the wafer 9.

Figure 3:
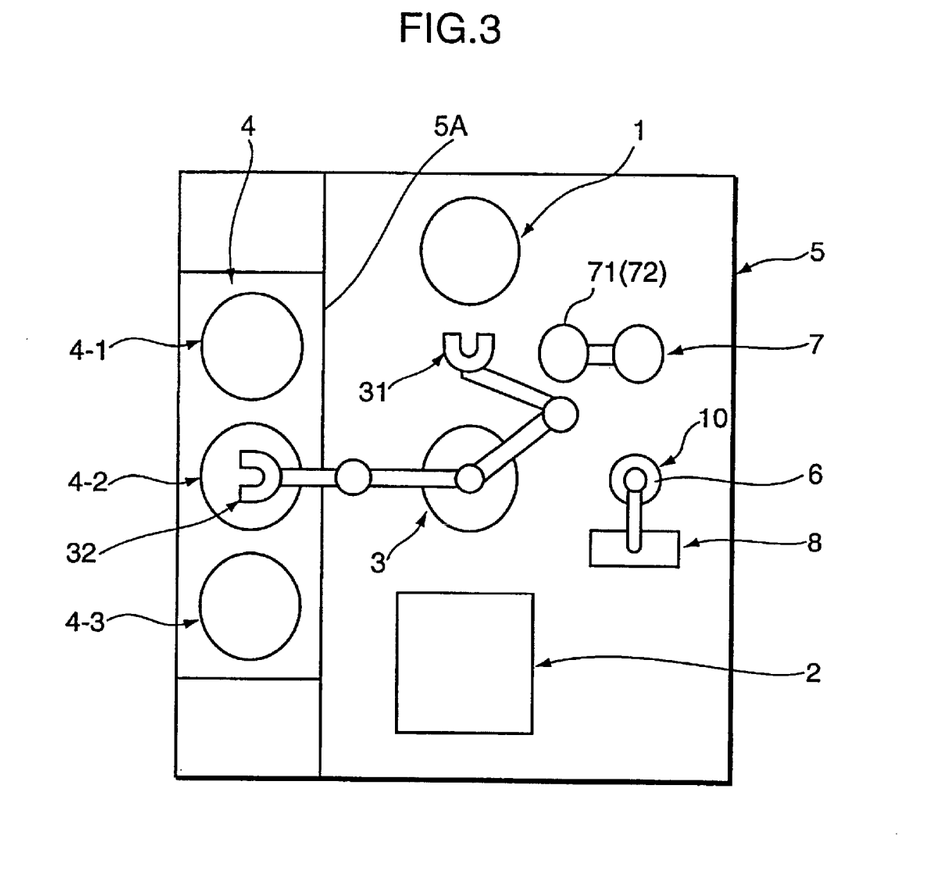
FIG. 3 is a plan view schematically showing a substrate processing system according to a second embodiment of the invention.
Figure 4:
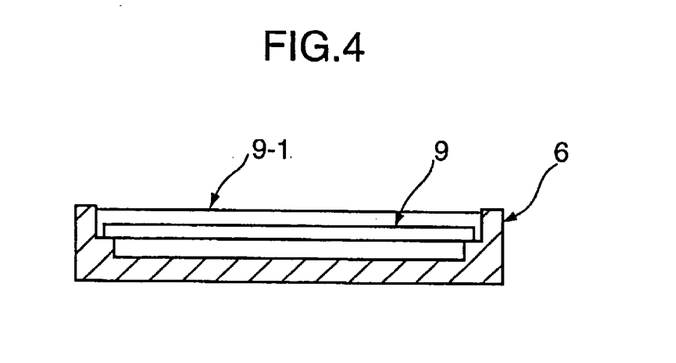
FIG. 4 is a sectional view showing a transferable vessel.
Figure 5:
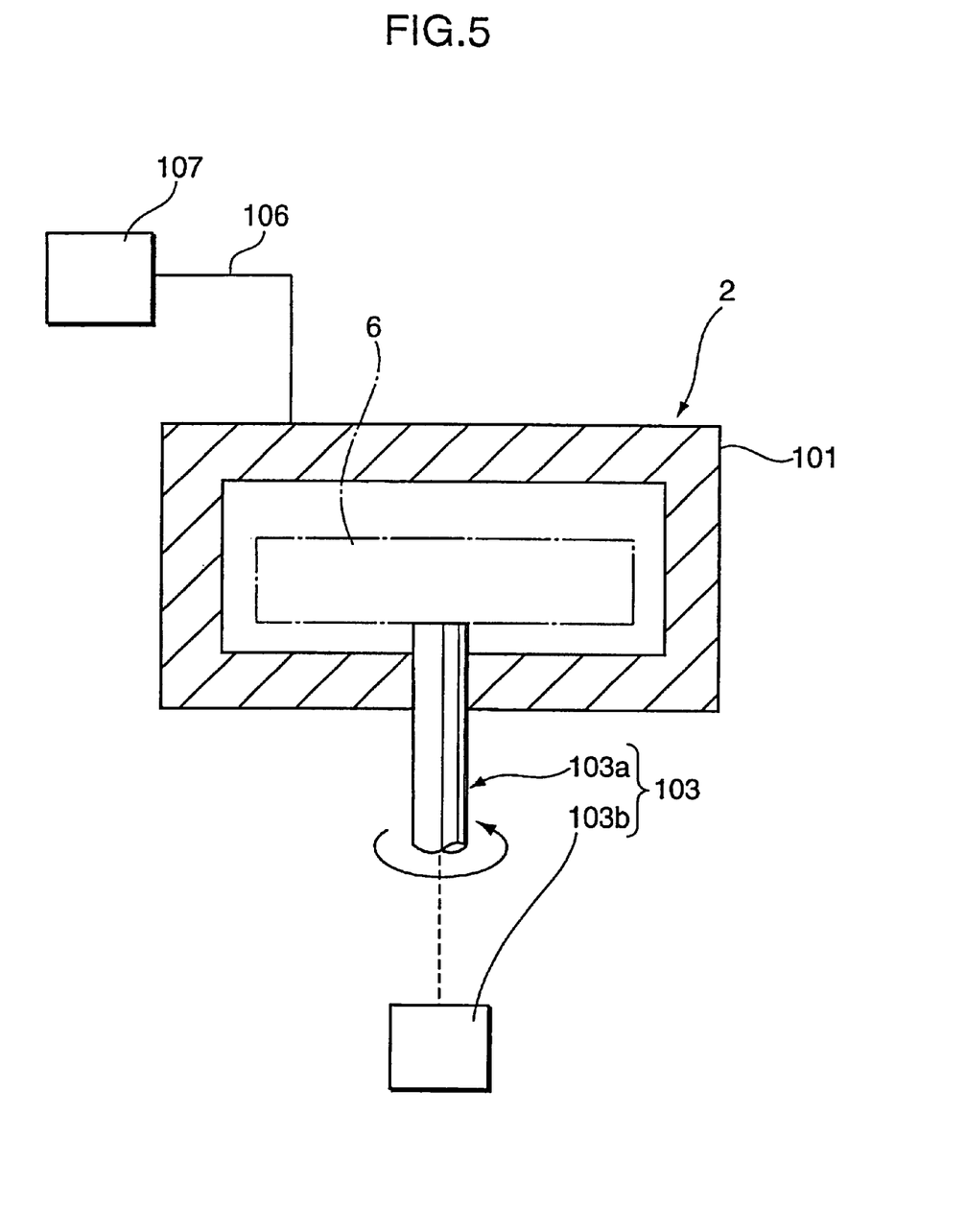
FIG. 5 is a sectional view showing an arrangement of a drying apparatus in the substrate processing system shown in FIG. 3.

Next, a substrate processing system according to a second embodiment of the invention is described with reference to FIGS. 3 through 5. FIG. 3 is a plan view schematically showing an arrangement of the substrate processing system according to the second embodiment. Since the basic construction of the substrate processing system of the second embodiment is identical to that of the first embodiment shown in FIG. 1, elements in the second embodiment that are identical to those in the first embodiment are denoted at the same reference, description thereof is omitted herein, and elements in the second embodiment which are differentiated from the first embodiment are described in detail.

The second embodiment is identical to the first embodiment in that a wafer 9 after a wet processing is transferred from a wet processing apparatus 1 to a drying apparatus 2 in the non-dried state for supercritical drying. However, the second embodiment is different from the first embodiment in that a wafer 9 after the wet processing is transferred to a transferable vessel 6 before being transferred to the drying apparatus 2.

Specifically, the transferable vessel 6 is located on a vessel station 10 provided in the middle between the wet processing apparatus 1 and the drying apparatus 2 and on a side of the wafer transferring apparatus 3 in FIG. 3. A liquid supplying apparatus 8 is provided on the vessel station 10 to supply a protecting liquid or deionized water in the transferable vessel 6. The transferable vessel 6 is, as shown in FIG. 4, a dish-like vessel with an opening opened upward.

A wafer loading apparatus 7 is provided between the wet processing apparatus 1 and the vessel station 10 to load and unload a wafer to and from the transferable vessel 6. Similar to the wafer transferring apparatus 3, the wafer loading apparatus 7 includes a first holding member 71 for transferring a wet wafer 9, and a second holding member 72 for transferring a dried wafer 9. As will be described later, the first holding member 71 takes a wafer 9 out of the wet processing apparatus 1 after the wet processing, and transfers the wafer 9 to the transferable vessel 6, and the second holding member 72 takes a wafer 9 out of the drying apparatus 2 after supercritical drying for the next processing.

Although not illustrated, a first arm 31 and a second arm 32 of the wafer transferring apparatus 3 each have a wafer support portion and a vessel holding portion. With this arrangement, the wafer transferring apparatus 3 can transfer the transferable vessel 6 along with a wafer 9 accommodated therein. Specifically, in the second embodiment, the wafer transferring apparatus 3 and the wafer loading apparatus 7 constitute a wafer transfer.

In the second embodiment, a high-pressure vessel 101 of the drying apparatus 2 is not provided with the wafer holder 102 that is provided in the first embodiment, and the transferable vessel 6 is directly linked to a rotation driving mechanism 103 of the drying apparatus 2. Further, in the second embodiment, the high-pressure vessel 101 is not provided with a liquid inlet 201 for supplying a protecting liquid (deionized water) into the high-pressure vessel 101, the supplying pipe 104, and the supplying source 105 that are provided in the first embodiment. In the second embodiment, the liquid supplying apparatus 8 serves as a liquid supplier.

In the second embodiment having the above arrangement, upon completion of the wet processing in the wet processing apparatus 1, a wafer 9 is taken out of the wet processing apparatus 1 in the non-dried state by the wafer holding portion of the first arm 31 of the wafer transferring apparatus 3, and is loaded to the wafer loading apparatus 7, which in turn is operated to accommodate the wafer 9 into the transferable vessel 6 placed on the vessel station 10.

When the wafer 9 is loaded to the transferable vessel 6, the liquid supplying apparatus 8 is actuated to supply a protecting liquid or deionized water into the transferable vessel 6. At this time, as shown in FIG. 4, deionized water is supplied to such a level as to cover the upper surface of the wafer 9, thereby allowing the entirety of the wafer 9 to be immersed in the deionized water. It may be preferable to fill the transferable vessel 6 with deionized water prior to accommodation of a wafer 9 into the transferable vessel 6.

Upon completion of the supply of deionized water, the transferable vessel 6 is transferred from the vessel station 10 to the drying apparatus 2 by the vessel holding portion of the first arm 31 of the wafer transferring apparatus 3, and then, is linked to the rotation driving mechanism 103 in the high-pressure vessel 101.

When the transferable vessel 6 is linked to the rotation driving mechanism 103, supercritical carbon dioxide with its temperature and pressure regulated at a supplying source 107 is supplied to the supercritical drying apparatus 2 via a supplying pipe 106 to render the interior of the high-pressure vessel 101 into a supercritical state (e.g., temperature: 35° C., pressure: MPa) for supercritical drying of the wafer 9 in the transferable vessel 6. At this time, the transferable vessel 6 and the wafer 9 are integrally rotated at a low speed (about 20 to 500 rpm) by actuation of the rotation driving mechanism 103. Thereby, deionized water remaining in the transferable vessel 6 and/or adhered on the wafer 9 is promptly removed. Thus, similar to the first embodiment, the drying processing of the wafer 9 is quickly completed. Preferably, the interior space of the transferable vessel 6 in which the wafer 9 is placed is configured into a reversed conical shape (U-shape in section) with a relatively large depth in the middle and a smaller depth at a brim portion thereof so as to smoothly flow the deionized water out of the wafer 9 due to a centrifugal force exerted to the wafer 9.

Upon lapse of a certain time after the supercritical drying, the pressure inside the high-pressure vessel 101 is lowered to an atmospheric pressure. Then, the wafer 9 is taken out of the drying apparatus 2 along with the transferable vessel 6 by the vessel holding portion of the second arm 32 of the wafer transferring apparatus 3, and is placed on the vessel station 10. Upon arrival of the transferable vessel 6 at the vessel station 10, the wafer 9 is taken out of the transferable vessel 6 by the second holding member 72 of the wafer loading apparatus 7, and is loaded to the wafer holding portion of the second arm 32 of the wafer transferring apparatus 3, which in turn transfers the wafer 9 to a predetermined cassette 4-1 (or 4-2, or 4-3) of a cassette station 4.

According to the substrate processing system of the second embodiment, a wafer 9 after a wet processing is accommodated in the transferable vessel 6, and is immersed in deionized water in the transferable vessel 6 before transferring to the drying apparatus 2. This arrangement securely enables to keep the wafer 9 from being air-dried during transfer from the wet processing apparatus 1 to the drying apparatus 2, or in the stand-by period in the drying apparatus 2 before supercritical drying is started.

Further, the transferable vessel 6 is rotated at an adequate speed at the time of supercritical drying in the drying apparatus 2. This arrangement enables to promptly remove deionized water remaining in the transferable vessel 6 by a centrifugal force exerted to the transferable vessel 6. This is effective in expediting drying in the drying apparatus 2 while securely keeping the wafer 9 from being air-dried.

The first and second embodiments are merely some of the examples of the substrate processing system to which the invention is applied. The invention can be modified or altered as far as such modifications and alterations do not depart from the gist of the invention. For instance, the following modifications and alterations are applicable.

(1) In the foregoing embodiments, one wet processing apparatus 1 and one drying apparatus 2 are provided. Alternatively, the number of the wet processing apparatus (or the drying apparatus) may be plural when need arises to do. Alternatively, a baking furnace and a replacing apparatus may be additionally provided.

(2) In the foregoing embodiments, the wafer transferring apparatus 3 includes a stationary type apparatus having a swing arm, such as a scalar type robot. Alternatively, the wafer transferring apparatus 3 may include a movable apparatus capable of running. Alternatively, a dedicated wafer carrying apparatus may be additionally provided to the cassette station to load and unload a wafer 9 to and from the cassette 4-1 (or 4-2, or 4-3). With such a modified arrangement, a wafer 9 can be transferred between the wafer transferring apparatus 3 and the cassette station by way of the wafer carrying apparatus.

(3) In the foregoing embodiments, the wafer transferring apparatus 3 includes two arms of the first arm 31 and the second arm 32 to allow the first arm 31 and the second arm 32 to perform their respective operations independently before and after the supercritical drying. In the case where there is no likelihood that a wafer is contaminated, it is possible to use a single arm to transfer the wafer 9 between a processing before the supercritical drying and a processing after the supercritical drying. Such a modified arrangement simplifies the construction of the wafer transferring apparatus 3.

(4) In the foregoing embodiments, the liquid supplier, such as the supplying pipes 104, 105 in the first embodiment, and the transferable vessel 6, the liquid supplying apparatus 8 in the second embodiment, are provided to keep a wafer 9 from air-drying during the time after the wet processing is completed and before the supercritical drying is started. Alternatively, in the case where there is no likelihood that a wafer 9 is not air-dried owing to a chemical property of a working liquid, the liquid supplier may be omitted to simplify the construction of the system. In the case where there is the demand for use of a variety of working liquids by eliminating constraint in the kind of working liquid usable for the wet processing apparatus 1, it may be preferable to provide the liquid supplier as disclosed in the embodiments.

(5) In the foregoing embodiments, a rinsing liquid or deionized water as a protecting liquid or protecting liquid is supplied to the wafer 9 at a final step in the wet processing. As far as a wafer 9 is effectively kept from being air-dried, a liquid other than the protecting liquid can be used.

(6) In the first embodiment, it is preferable to allow the liquid supplying pipe 104 to continue supply of deionized water for a certain time after start of supercritical drying. With such a modified arrangement, the wafer 9 is carried to a supercritical drying process while continuously supplied with deionized water. This is advantageous in securely preventing air-dry of the wafer 9. However, since the interior of the high-pressure vessel 101 is kept at a high pressure during the supercritical drying, it is necessary to provide a liquid supplying pipe and peripheral parts thereof having rigidity against such a high pressure, as the liquid supplier.

(7) In the first embodiment, preferably, a liquid supplier is provided in the wafer transferring apparatus to allow the liquid supplier to supply deionized water to a wafer during a stand-by period before supercritical drying is started.

(8) In the foregoing embodiments, a wafer is rotated during supercritical drying. It is possible to subject a wafer to a supercritical drying while keeping the wafer in a stationary state. However, performing a supercritical drying while rotating the wafer 9 is desirable to perform prompt drying of the wafer because such an arrangement enables to promptly and effectively remove deionized water adhered to the wafer 9 and/or remaining in its vicinity thereof, as mentioned above.

(9) In the foregoing embodiments, supercritical carbon dioxide with its temperature and pressure regulated at the supplying source 107 is supplied to the high-pressure vessel 101 for supercritical drying. Alternatively, supercritical state may be established by drawing liquefied carbon dioxide to the high-pressure vessel 101 and raising the temperature in the high-pressure vessel 101. With such a modified arrangement, a wafer can be subjected to supercritical drying.

(10) In the second embodiment, the transferable vessel 6 accommodates a single wafer. Alternatively, the transferable vessel 6 may be so constructed as to accommodate a plurality of wafers in a stacked state one over another.

(11) In the foregoing embodiments, the wafer loading apparatus 7 has two holding members of the first holding member 71 and the second holding member 72 to allow the two holding members to independently perform their operations before and after the supercritical drying. In the case where there is no likelihood that a wafer is contaminated, a common holding member may be used to load and unload a wafer to and from the transferable vessel 6 before and after the supercritical drying. Such a modification is advantageous in simplifying the construction of the wafer loading apparatus 7.

It should be appreciated that the features of supplying a protecting liquid to a wafer after a wet processing, rotating the wafer with supply of the protecting liquid, and rotating the wafer during supercritical drying are applicable to a one-bath processing way in which a wet processing and a supercritical drying are performed in a single vessel. In such a case, a wafer to be processed is loaded to the supercritical drying apparatus, and a working liquid is supplied to the supercritical drying apparatus for performing a wet processing to the wafer. After the wet processing, supercritical drying is carried out without performing spin-dry. Specifically, after completing the wet processing, supercritical drying is started by supplying the protecting liquid to a wafer in combination with rotation of the wafer according to needs, thereby performing the supercritical drying without air-dry of the wafer. During the supercritical drying, the supercritical drying is promoted by rotating the wafer. Steps to be carried out by this modified system after the supercritical drying processing are the same as in the foregoing embodiments.

Although the system and method utilizing the one-bath processing way provides a restricted kind of working liquid, and hinders use of an expanded kinds of working liquids, the system employing the one-bath processing way is compact because a wet processing apparatus that is usually required in a system without adopting the one-bath processing way is not necessary. Therefore, as far as a specific working liquid having a moderate chemical property is used in the wet processing, the system and method utilizing the one-bath processing way can be put into practice. For instance, such a system and method are suitable to production of MEMS, which uses temporary layers made of a water-soluble material, because deionized water and alcohol are used as protecting liquid.

As described above, an inventive method for processing a substrate comprises the steps of: performing a wet processing by supplying a working liquid to a substrate in a wet processing apparatus; transferring the substrate in a non-dried state from the wet processing apparatus to a drying apparatus; and subjecting the substrate to a supercritical drying by a supercritical fluid in the drying apparatus.

In this method, the supercritical drying is performed in the drying apparatus to dry the substrate. The supercritical drying can be performed without influence of a capillary force. The wet processing and the drying are performed in the respective apparatus. Accordingly, more variety of working liquids for wet processing can be selectively used in association with a high-pressure vessel, which thus eliminates the drawback of corrosion of a working liquid against the inner surface of the high-pressure vessel. Furthermore, this method can eliminate the problem that a long time is required to supply the working liquid in and out of the high-pressure vessel in the system and method adopting the one-bath processing.

Preferably, there may be provided the step of supplying a protecting liquid to the substrate after the wet processing and before the supercritical drying. Accordingly, air-dry of the substrate before start of the supercritical drying can be assuredly prevented.

The protecting liquid may be preferably supplied to the substrate in the drying apparatus. Further, it may be preferable to supply the protecting liquid while rotating the substrate. Supplying the liquid while rotating the substrate can effectively remove foreign matters such as dusts that have been adhered to the substrate during the transfer by a centrifugal force exerted thereto. Further, the substrate can be uniformly subjected to a wet processing with a minimal supply of the liquid.

The substrate processing method may be further provided with steps of transferring the substrate to a transferable vessel after the wet processing, allowing the substrate to be immersed in the protecting liquid by supply of the protecting liquid into the transferable vessel, and transferring the substrate with the transferable vessel to the drying apparatus. Accordingly, air-dry of the substrate during the transfer can be securely prevented.

The substrate may be preferably rotated in the supercritical drying. The rotation of the substrate during the supercritical drying enables quick removal of the working liquid and the like adhered to the substrate by a centrifugal force exerted to the substrate, consequently remarkably decreasing the drying time.

The wet processing may be preferably performed by a series of processings of development, deposition, etching, and washing while supplying the working liquid to the substrate in a predetermined order.

Further, preferably, the supercritical drying may be performed by rendering an interior of the drying apparatus into a supercritical state by supplying a supercritical fluid, retaining the supercritical state for a predetermined time, depressurizing the interior of the drying apparatus to an atmospheric pressure after the lapse of the predetermined time, and taking the substrate out of the drying apparatus after the supercritical drying.

Also, an inventive substrate processing system comprises: a wet processing apparatus which performs a predetermined wet process by supplying a working liquid to a substrate; a drying apparatus which is independently provided of the wet processing apparatus and performs a supercritical drying to the substrate by a supercritical fluid; and a substrate transfer which transfers the substrate into and out of the wet processing apparatus and the drying apparatus.

In this system, after a predetermined wet process is performed to a substrate or a wafer in the wet processing apparatus, the substrate is transferred to the drying apparatus independently provided of the wet processing apparatus by the substrate transfer, and the substrate in a non-dried state is subjected to supercritical drying in the drying apparatus. This system can make working liquids for wet processing free from the restriction in association with use of a high-pressure vessel. This will expand the kind of working liquids, and eliminates the necessity of coating of corrosion resistive agent on the inner surface of the high-pressure vessel. Furthermore, this arrangement eliminates the drawback that a long time is required to supply a working liquid in and out of the high-pressure vessel in the system and method adopting the one-bath processing way.

Preferably, the substrate processing system may be further provided with a liquid supplier which supplies a protecting liquid to the substrate after the wet processing and before the supercritical drying.

In the substrate processing system, preferably, the drying apparatus includes a substrate holder which rotatably holds the substrate thereon, and the drying apparatus performs the drying with the substrate being rotated. The substrate can be rotated during the drying. Specifically, rotating the substrate in the drying enables to effectively remove the working liquid and the like adhered to the substrate owing to a centrifugal force exerted to the substrate, thereby assuring a quick drying.

Preferably, in the substrate processing system, the liquid supplier includes a vessel having such a construction as to accommodate the substrate therein and to allow the substrate to be immersed in the protecting liquid by supply of the protecting liquid, and the substrate transfer is operative to take the substrate out of the wet processing apparatus after the wet processing to place the substrate in the vessel, and to transfer the vessel with the substrate to the drying apparatus. The substrate is transferred while being immersed in the liquid. Accordingly, air-dry of the substrate before start of the supercritical drying can be securely prevented.

Preferably, in the substrate processing system, the substrate transfer includes a first transferring portion operable to take the substrate in a non-dried state out of the wet processing apparatus after the wet processing, and a second transferring portion operable to transfer the dry substrate after the supercritical drying. This is advantageous in keeping the working liquid from adhering to the substrate after the supercritical drying by way of the transfer.

Preferably, in the substrate processing system, the substrate transfer may be preferably provided with a first transferring apparatus having a substrate holder which directly holds the substrate and a vessel holder which holds the vessel, and a second transferring apparatus which loads and unloads the substrate to and from the vessel.

This application is based on Japanese patent application serial Nos. 2001-133004 and 2001-239084 filed in Japan Patent Office, the contents of which are hereby incorporated by reference.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

What is claimed is:

1. A method for processing a substrate comprising:
   a wet processing step of processing a substrate by supplying a working liquid to the substrate in a wet processing apparatus;
   a transferring step of transferring the processed substrate in a non-dried state from the wet processing apparatus to a drying apparatus; and
   a supercritical drying step of subjecting the processed substrate to a supercritical drying at an elevated pressure by a supercritical fluid in the drying apparatus.

2. The method according to claim 1, further comprising a step of supplying a protecting liquid to the processed substrate after the wet processing step and before the supercritical drying step.

3. The method according to claim 2, wherein the protecting liquid is supplied to the substrate in the drying apparatus.

4. The method according to claim 3, wherein the protecting liquid is supplied to the substrate while rotating the substrate.

5. The method according to claim 2, further comprising steps of: transferring the substrate into a transferable vessel after the wet processing; supplying the protecting liquid into the transferable vessel to immerse the substrate in the transferable vessel; and transferring the transferable vessel with the substrate to the drying apparatus.

6. The method according to claim 1, wherein the substrate is dried in the drying apparatus while being rotated.

7. The method according to claim 1, wherein the wet processing step includes a series of processings of development, deposition, etching, and washing while supplying working liquids to the substrate in a predetermined order.

8. A method for processing a substrate comprising:
   a wet processing step of processing a substrate by supplying a working liquid to the substrate in a wet processing apparatus:
   a transferring step of transferring the processed substrate in a non-dried state from the wet processing apparatus to a drying apparatus; and
   a supercritical drying step of subjecting the processed substrate to a supercritical drying by a supercritical fluid in the drying apparatus, wherein the supercritical drying step includes steps of; rendering an interior of the drying apparatus into a supercritical state by supplying a supercritical fluid; retaining the supercritical state for a predetermined time; depressurizing the interior of the drying apparatus to an atmospheric pressure after the lapse of the predetermined time; and taking the substrate out of the drying apparatus after the supercritical drying.

9. A system for processing a substrate comprising:
   a wet processing apparatus which performs a wet processing by supplying a working liquid to a substrate;
   a drying apparatus comprising a pressure vessel provided independently of the wet processing apparatus and performs a supercritical drying to the substrate by a supercritical fluid; and
   a substrate transfer which transfers the substrate out of the wet processing apparatus and to the drying apparatus in non-dried state.

10. The system according to claim 9, further comprising a liquid supplier which supplies a protecting liquid to the substrate after the wet processing and before the supercritical drying.

11. The system according to claim 10, wherein the liquid supplier includes a vessel which accommodates the substrate and allows the substrate to be immersed in the protecting liquid by supply of the protecting liquid, and the substrate transfer takes the substrate out of the wet processing apparatus after the wet processing, and places the substrate in the vessel, and transfers the vessel with the substrate into the drying apparatus.

12. The system according to claim 11, wherein the substrate transfer includes a first transferring apparatus having a substrate holder which directly holds the substrate and a vessel holder which holds the vessel, and a second transferring apparatus which loads and unloads the substrate from and into the vessel.

13. The system according to claim 9, wherein the drying apparatus includes a substrate holder which rotatably holds the substrate to dry the substrate while rotating the substrate.

14. The system according to claim 9, wherein the transfer includes a first transfer portion which takes the substrate out of the wet processing apparatus after the wet processing and transfers the substrate in a non-dried state into the drying apparatus, and a second transfer portion which takes the substrate out of the drying apparatus after the supercritical drying and transfers the substrate to a specified location.

15. The method according to claim 1, wherein the supercritical drying step includes a step of depressurizing an interior of the drying apparatus to an atmospheric pressure after the supercritical drying.

16. The method according to claim 1, wherein the supercritical drying step includes a step of depressurizing an interior of the drying apparatus to an atmospheric pressure after retaining a supercritical state for a predetennined time.

17. The system according to claim 9, wherein the drying apparatus is depressurized to an atmospheric pressure after the supercritical drying is performed.

18. The system according to claim 9, wherein the drying apparatus is depressurized to an atmospheric pressure after a supercritical state is retained for a predetermined time.

* * * * *